United States Patent
Zhao et al.

(10) Patent No.: US 9,438,005 B1
(45) Date of Patent: Sep. 6, 2016

(54) CALIBRATION OF A TUNABLE DBR LASER

(71) Applicant: Google Inc., Mountain View, CA (US)

(72) Inventors: Xiangjun Zhao, Fremont, CA (US);
Cedric Fung Lam, Belmont, CA (US);
Steven Fong, Sunnyvale, CA (US)

(73) Assignee: Google Inc., Mountain View, CA (US)

( * ) Notice: Subject to any disclaimer, the term of this patent is extended or adjusted under 35 U.S.C. 154(b) by 45 days.

(21) Appl. No.: 14/293,604

(22) Filed: Jun. 2, 2014

(51) Int. Cl.
*H01S 3/10* (2006.01)
*H01S 3/139* (2006.01)
*H01S 5/0625* (2006.01)
*H01S 5/125* (2006.01)

(52) U.S. Cl.
CPC .............. *H01S 3/139* (2013.01); *H01S 5/0625* (2013.01); *H01S 5/06255* (2013.01); *H01S 5/06256* (2013.01); *H01S 5/125* (2013.01)

(58) Field of Classification Search
CPC .. H01S 3/139; H01S 5/0625; H01S 5/06258; H01S 5/06255; H01S 5/125
See application file for complete search history.

(56) References Cited

U.S. PATENT DOCUMENTS

| | | | | |
|---|---|---|---|---|
| 5,325,382 A * | 6/1994 | Emura | ............... | H01S 5/06256 372/26 |
| 6,359,915 B1 * | 3/2002 | Koch | ................. | H01S 5/06256 372/102 |
| 2003/0223470 A1 | 12/2003 | Ackerman et al. | | |
| 2005/0286575 A1 * | 12/2005 | Hattori | ................ | H01S 5/06213 372/29.02 |
| 2009/0168817 A1 * | 7/2009 | Ishikawa | ............... | H01S 5/0687 372/20 |
| 2010/0142568 A1 * | 6/2010 | Arimoto | ............... | G02F 1/3133 372/20 |
| 2013/0094854 A1 * | 4/2013 | Yan | ..................... | H01S 5/06256 398/38 |
| 2015/0288140 A1 * | 10/2015 | Davies | ................. | H01S 5/0261 372/33 |

FOREIGN PATENT DOCUMENTS

| EP | 1195861 A2 | 4/2002 |
|---|---|---|
| EP | 2128565 A1 | 12/2009 |

* cited by examiner

*Primary Examiner* — Yuanda Zhang
(74) *Attorney, Agent, or Firm* — Honigman Miller Schwartz and Cohn LLP

(57) ABSTRACT

A method of calibrating a tunable laser having a distributed Bragg reflector includes, aligning a reflection peak of the distributed Bragg reflector with a target cavity mode of a plurality of cavity modes defined by a total optical path length inside a resonant cavity of the tunable laser. The method includes aligning a resultant lasing mode with a target wavelength of an output wavelength grid. The resultant lasing mode is formed by alignment of the reflection peak of the distributed Bragg reflector with the target cavity mode. The method also includes setting a target output power and a target extinction ratio of the tunable laser.

27 Claims, 9 Drawing Sheets

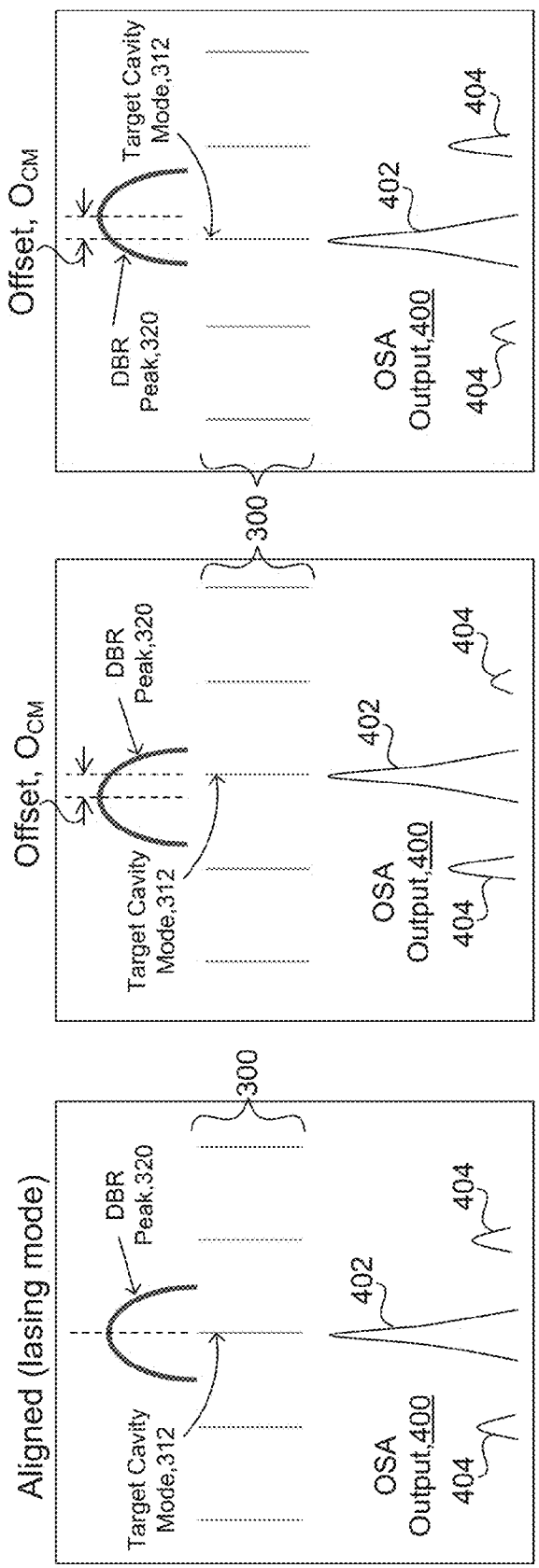

CALIBRATION OF A TUNABLE DBR LASER

TECHNICAL FIELD

This disclosure relates to the calibration of a tunable distributed Bragg reflector (DBR) laser.

BACKGROUND

Fiber optic communication is an emerging method of transmitting information from a source (transmitter) to a destination (receiver) using optical fibers as the communication channel. Optical fibers are flexible, transparent fibers made of thin glass silica or plastic that transmits light throughout the length of the fiber between the source and the destination. Fiber optic communications allows for the transmission of data over longer distances and at higher bandwidth than other known forms of communications. Fiber optics are an improved form of communication over metal wires because the light traveling through the fiber experiences less loss and is immune to electromagnetic interference. Companies use optical fibers to transmit telephone signals, internet communication, and cable television signals. Lasers can be used to generate optical signals for communication over fiber optic networks.

Referring to FIG. 1A, a tunable laser calibration system 100a conventionally includes a wavelength meter 110, an optical spectrum analyzer 120, and an oscilloscope 130, each receiving an output signal Sout from a tunable laser 200. An optical splitter 140 splits the output signal Sout for delivery to the wavelength analyzer 110, the optical spectrum analyzer 120, and the oscilloscope 130. An optical/electrical converter 142 converts the optical signal Sout to an electrical signal for receipt by the oscilloscope 130. The calibration system 100a generally uses the optical spectrum analyzer 120 to measure the shape of the output optical spectrum and the oscilloscope 130 to measure an output modulation amplitude (OMA) and an extinction ratio (ER) of a tunable laser 200. The calibration system 100a generally uses the wavelength meter 110 to calibrate the peak output wavelength from the tunable laser.

SUMMARY

The present disclosure provides, inter alia, a set of procedures to methodically calibrate a tunable distributed Bragg reflector (DBR) laser, which can be used in a telecommunication system as a directly modulated optical transmitter source. One aspect of the disclosure provides a method of calibrating a tunable laser having a distributed Bragg reflector or DBR (i.e., a grating section). The method includes aligning a reflection peak of the distributed Bragg reflector with a target cavity mode of a plurality of cavity modes. The plurality of cavity modes is defined by a total optical path length inside a resonant cavity, which is in turn defined by the distributed Bragg reflector, a phase-shift section and a gain section of the tunable laser. The method includes aligning a resultant lasing mode with a target wavelength of an output wavelength grid. The resultant lasing mode is formed by an alignment of the reflection peak of the distributed Bragg reflector with the target cavity mode. The method also includes setting a target output power and a target extinction ratio of a directly modulated tunable laser.

Implementations of the disclosure may include one or more of the following features. In some implementations, the method includes altering a bias current applied to the tunable laser to align the reflection peak of the distributed Bragg reflector with the target cavity mode. The method further includes monitoring the bias current and storing the bias current in non-transitory (e.g., non-volatile) memory when the reflection peak is aligned with the target cavity mode.

In some examples, the method further includes altering a temperature of the tunable laser to align the reflection peak of the distributed Bragg reflector with the target cavity mode. The method further includes monitoring the temperature of the tunable laser and optionally storing the temperature in non-transitory memory when the reflection peak is aligned with the target cavity mode. The method may also include altering the temperature of the resonant cavity of the tunable laser by a threshold temperature increment (e.g., 0.2 degrees Celsius) to shift a cavity frequency grid defined by the plurality of cavity modes to align with the reflection peak of the distributed Bragg reflector. The method may include determining an offset between the resultant lasing mode and the target wavelength of the output wavelength grid. In some examples, the method includes altering the temperature of the tunable laser to align the resultant lasing mode with the target wavelength of the output wavelength grid.

In some implementations, the method includes monitoring an optical output of the tunable laser while aligning the reflection peak of the distributed Bragg reflector with the target cavity mode to identify side modes of a resultant lasing mode formed by alignment of the reflection peak of the distributed Bragg reflector with the target cavity mode. The method may also include determining that the reflection peak is aligned with the target cavity mode when the neighboring side modes have equal amplitudes.

The method may further include monitoring an output power of an optical output of the tunable laser at each wavelength of the output wavelength grid while varying a modulation current delivered to a gain section of the tunable laser between a minimum modulation current and a maximum modulation current. In some examples, the method further includes determining the modulation current of the gain section of the tunable laser based on a relationship between the output power of the tunable laser and the modulation current applied to the gain section. The method may also include monitoring the output power of the tunable laser using a photodiode of the tunable laser.

Another aspect of the disclosure provides a tunable laser calibration system that includes a tunable laser and a controller. The tunable laser includes a gain section, a distributed Bragg reflector, and a power monitor (e.g., a photodiode). The distributed Bragg reflector and the power monitor are optically connected with the gain section. The controller is connected with the tunable laser, for example, it delivers current to the distributed Bragg reflector and the gain section and receives signals from the power monitor. The controller includes non-transitory memory and one or more data processing devices that are in communication with the non-transitory memory. The one or more data processing devices execute instructions that configure the one or more data processing devices to execute a calibration routine. The calibration routine includes aligning a reflection peak of the distributed Bragg reflector with a target cavity mode of a plurality of cavity modes defined by a total optical path length inside a resonant cavity defined by the distributed Bragg reflector, a phase section, and a gain section of the tunable laser. The calibration routine also includes aligning a resultant lasing mode with a target wavelength of an output wavelength grid. The resultant lasing mode is formed by the alignment of the reflection peak of the distributed Bragg reflector with the target cavity mode. The calibration routine also includes setting a target output power and a target extinction ratio of the tunable laser, which is directly modulated.

In some implementations, the calibration routine includes altering a bias current applied to the tunable laser to align the reflection peak of the distributed Bragg reflector with the target cavity mode. The calibration routine may include monitoring the bias current and storing the bias current in the non-transitory memory when the reflection peak is aligned with the target cavity mode.

In some examples, the calibration routine includes altering a temperature of the tunable laser to align the reflection peak of the distributed Bragg reflector with the target cavity mode. Moreover, the calibration routine may include monitoring the temperature of the tunable laser and storing the temperature in the non-transitory memory when the reflection peak is aligned with the target cavity mode. In some examples, the calibration routine includes altering the temperature of the resonant cavity of the tunable laser by a threshold temperature increment (e.g., 0.2 degrees Celsius) to shift a cavity frequency grid defined by the plurality of cavity modes to align with the reflection peak of the distributed Bragg reflector. The calibration routine may include determining an offset between the resultant lasing mode and the target wavelength of the output wavelength grid. To align the resultant lasing mode with the target wavelength of the output wavelength grid, the calibration routine may include altering a temperature of the tunable laser.

In some implementations, the calibration routine includes monitoring an optical output of the tunable laser while aligning a reflection peak of the distributed Bragg reflector with a target cavity mode to identify side modes of a resultant lasing mode formed by alignment of the reflection peak of the distributed Bragg reflector with the target cavity mode. The calibration routine also includes determining that the reflection peak is aligned with the target cavity mode when the neighboring side modes have equal amplitudes.

The calibration routine may further include monitoring the output power of the optical output of the tunable laser at each wavelength of the output wavelength grid while varying a modulation current delivered to a gain section of the tunable laser between a minimum modulation current and a maximum modulation current. The calibration routine may include determining the modulation current of the gain section of the tunable laser based on a relationship between the output power of the tunable laser and the modulation current applied to the gain section. In some examples, monitoring the output power of the tunable laser includes monitoring the output power using a photodiode of the tunable laser.

The details of one or more implementations of the disclosure are set forth in the accompanying drawings and the description below. Other aspects, features, and advantages will be apparent from the description and drawings, and from the claims.

DESCRIPTION OF DRAWINGS

FIGS. 4B-4D are schematic views of the process of aligning the side modes of the output of the exemplary tunable laser of the tunable laser calibration system.

Like reference symbols in the various drawings indicate like elements.

DETAILED DESCRIPTION

Figure 1A:
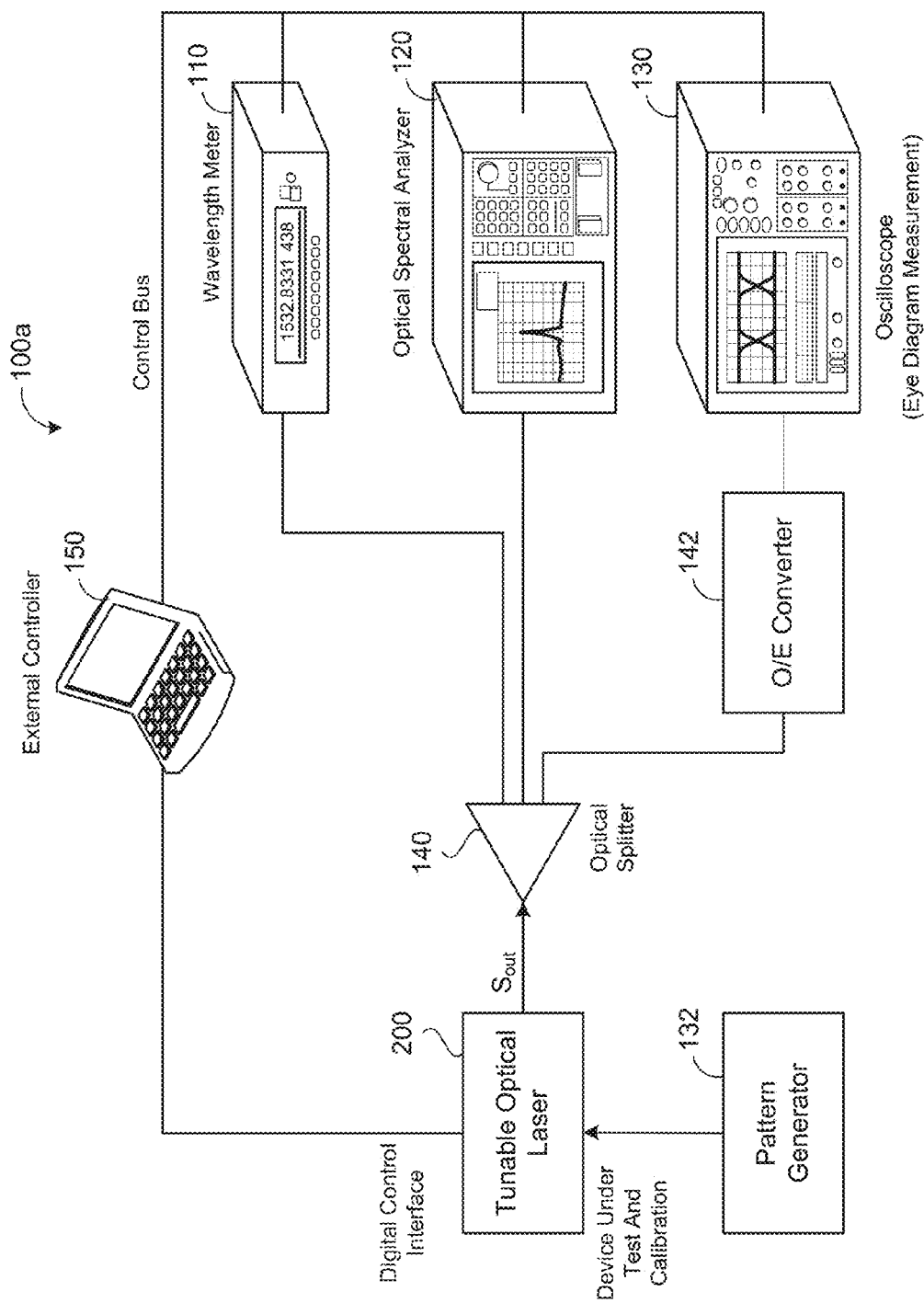
FIG. 1A is a schematic view of a conventional tunable laser calibration system.
Figure 1B:
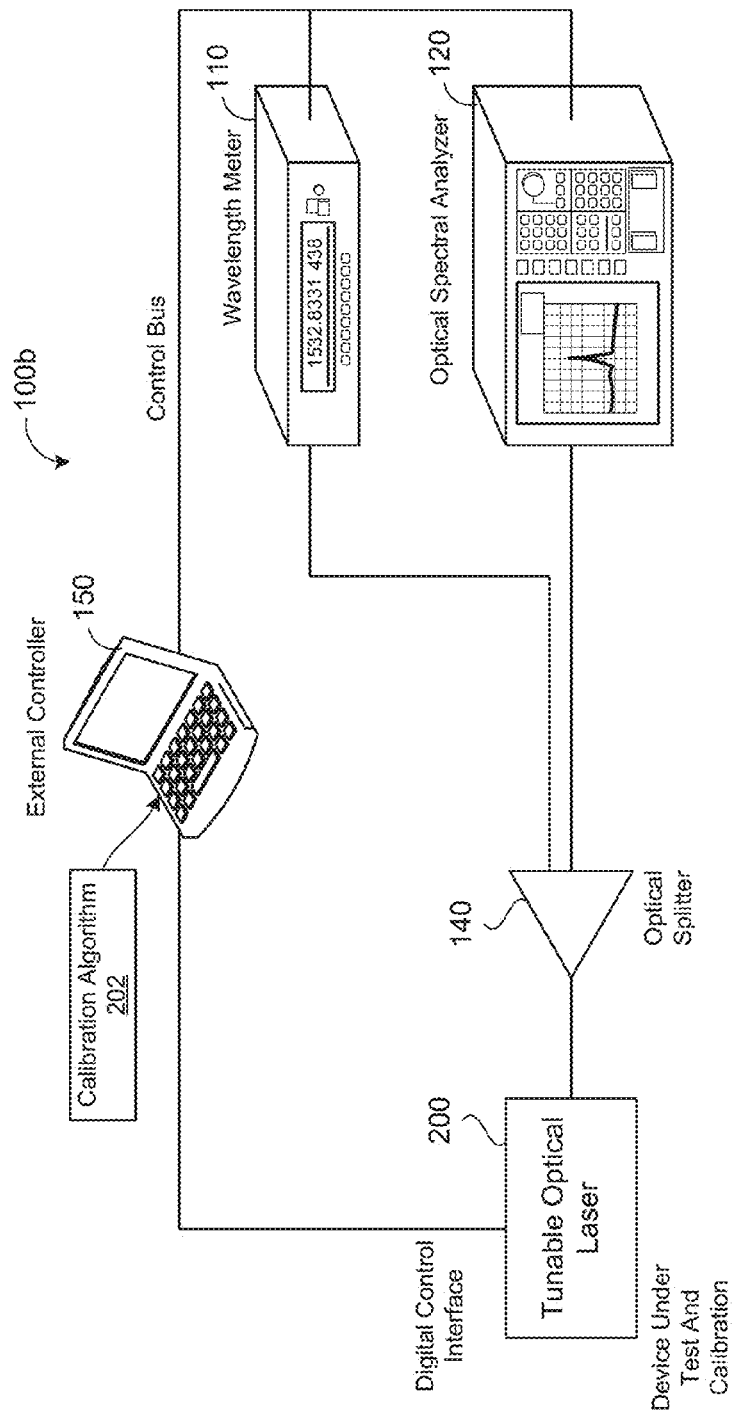
FIG. 1B is a schematic view of an exemplary tunable laser calibration system.

Referring to FIGS. 1A and 1B, unlike conventional calibration systems 100$a$ that use an optical spectrum analyzer 120 and an oscilloscope 130 to measure an output modulation amplitude and an extinction ratio of the tunable laser 200, a calibration system 100$b$ may determine the output modulation amplitude and the extinction ratio of the tunable laser 200 using an internal power monitor 220 (e.g., photodiode) (see FIG. 2) of a tunable laser 200. As a result, the calibration system 100$b$ does not need the oscilloscope 130. As such, in some implementations, the calibration system 100$b$ includes a wavelength meter 110 and an optical spectrum analyzer 120, each receiving an output signal Sout from a tunable laser 200 (thus omitting the oscilloscope 130). An optical splitter 140 splits the output signal Sout for delivery to the wavelength meter 110 and the optical spectrum analyzer 120. The calibration system 100$b$ may use the wavelength meter 110 to calibrate a wavelength reference or set a desired wavelength $\lambda_{out}$ of the tunable laser 200. The calibration system 110$b$ also includes an external controller 150 (e.g., a computer) having a digital control interface in communication with the tunable laser 200, the wavelength meter 110, and the optical spectrum analyzer 120. The external controller 150 (FIG. 2) includes non-transitory memory 152 and one or more data processing devices 154 in communication with the memory 152.

Memory may be physical devices used to store programs (e.g., sequences of instructions) or data (e.g., program state information) on a temporary or permanent basis for use by a computing device (e.g., the one or more data processing devices 154). The non-transitory memory may be volatile and/or non-volatile addressable semiconductor memory. Examples of non-volatile memory include, but are not limited to, flash memory and read-only memory (ROM)/ programmable read-only memory (PROM)/erasable programmable read-only memory (EPROM)/electronically erasable programmable read-only memory (EEPROM) (e.g., typically used for firmware, such as boot programs). Examples of volatile memory include, but are not limited to, random access memory (RAM), dynamic random access memory (DRAM), static random access memory (SRAM), phase change memory (PCM) as well as disks or tapes.

Figure 2:
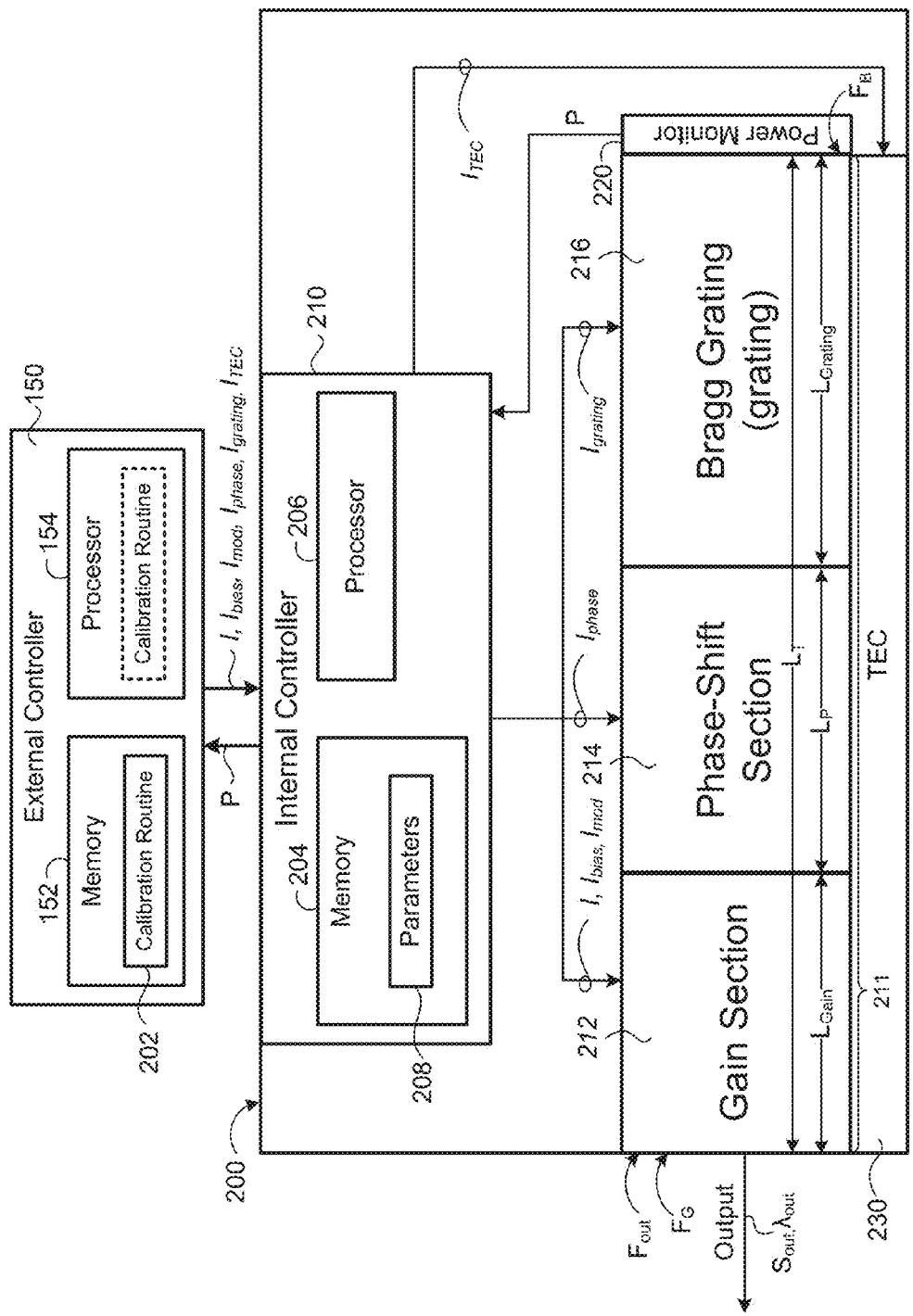
FIG. 2 is a schematic view of the exemplary tunable laser calibration system.

A tunable laser 200 can be used to transmit information on an optical fiber link using different wavelengths or optical frequencies. FIG. 2 illustrates an exemplary semiconductor tunable laser 200 based on a distributed Bragg reflector (DBR) structure. The tunable laser 200 is a high-frequency oscillator, which requires amplification, feedback, and a tuning mechanism that determines the frequency. Lasers emit light coherently such that the laser output is a narrow beam of light. In some implementations, a laser includes a gain medium that provides the amplification and mirrors that provide the feedback. Photons bounce off one mirror through the medium and head back to another mirror to bounce back for further amplification. One, and sometimes both mirrors, may partially transmit light to allow a fraction of the generated light to be emitted. A laser diode is an electrically pumped semiconductor laser having an active medium being a p-n junction. The p-n junction is created by doping (i.e., introduction of impurities into a pure semiconductor to change its electrical properties). The gain medium usually provides gain over a broad frequency spectrum and a basic laser without a frequency selection mechanism may emit multiple output frequencies. A tunable DBR laser 200 emits lights at specific frequencies, which can be tuned with a frequency selection mechanism.

In general, tunable lasers 200 tend to be more expensive than non-tunable lasers because during manufacturing, tunable lasers require time and effort to calibrate, measure, and test at different wavelengths during the manufacturing process. For example, a tunable laser system 200 having 32-channels has to be calibrated at each one of the 32 channels, i.e., calibration occurs 32 times. Thus, it is desirable to have a tunable laser calibration system 100b that reduces the effort and time to calibrate, measure, and test the different wavelengths, which ultimately results in a reduction of cost of the tunable laser 200 by reducing the manufacturing time and labor. Generally, three devices are needed to perform calibration of a direct on-off keying modulated tunable laser used in a telecommunication systems: an optical wavelength meter 110 (for measuring the output wavelengths of the tunable laser); an optical spectrum analyzer (OSA) 120 (for measuring the output optical spectrum); and a digital sampling scope 130 (for measuring an extinction ratio of the tunable laser 200 when the laser is modulated). The digital sample scope 130 is used in conjunction with a pattern generator 132 which modulates the laser 200. These devices 110, 120, 130 are generally expensive and, in some examples, may be simplified by calibrating the tunable laser 200. Therefore, it is desirable to have a tunable DBR laser calibration system 100b that includes a tunable laser 200 capable of self-calibration and eliminates the use of the digital sampling scope 130 during most of the calibration process. Reducing the use of the optical spectrum analyzer 120 and the digital sampling scope 130 improves the throughput of the calibration process in a production line with the same number of optical spectrum analyzer and digital sampling scope setups, which reduces the manufacturing cost. The tunable laser calibration system 100b eliminates the use of a pattern generator and the sampling scope 130, and uses an internal power monitor 220 (FIG. 2) within the tunable laser 200 to perform the calibration that is usually performed by the two eliminated devices. Moreover, the tunable DBR laser calibration system 100b reduces the length of time the wavelength meter 110 is used to calibrate the wavelength reference. The tunable laser calibration system 100b has a relatively lower cost by eliminating the use of expensive calibration equipment, i.e., the pattern generator and the sampling scope. Moreover, the tunable DBR laser 200 self-calibrates every time the laser turns on, thus maintaining a more accurate laser calibration.

With continued reference to FIG. 2, in some implementations, the tunable laser 200 includes an internal controller 210, a gain section 212, a phase-shift section 214, a grating section 216 for tuning the optical signal (e.g., Distributed Bragg Reflector (DBR)), and a power monitor 220 (e.g., a photodiode). The tunable laser 200 is mounted on a thermoelectric cooler (TEC) 230 and supplied with a driving current $I_{TEC}$. The internal controller 210 includes non-transitory memory 204 and one or more data processing devices 206 in communication with the non-transitory memory 204. The one or more data processing devices 206 execute a calibration routine 202.

The gain section 212 generates and modulates an optical signal $S_{out}$. In order to generate and modulate the optical signal $S_{out}$, the gain section 212 may be in a non-thermal energy distribution state known as a population inversion state. Population inversion occurs when a greater number of atoms or molecules within a system are in an excited state than in lower energy states. The preparation of the population inversion state entails applying an external energy source, known as laser pumping to the system. Laser pumping occurs when an external source of energy is transferred to the gain section 212 of a tunable laser 200. The gain section 212 absorbs the energy, resulting in an excited state of the molecules of the gain section 212 to achieve the population inversion state. The pump energy is usually in the form of light or an electric current I applied to the gain section 212. Other examples of pump energy may be used, such as chemical or nuclear reactions. Generally, electrical pumping is used in a semiconductor laser.

The phase-shift section 214 is disposed on the gain section 212, and imparts a phase shift to the optical signal inside the cavity to create the boundary condition needed for lasing at a particular wavelength and stabilize the laser output mode with active control. In some examples, the phase-shift section 214 has a length $L_P$ along a direction of optical signal propagation $S_{out}$.

The grating section 216 is positioned adjacent to the phase-shift section 214 and opposite the gain section 212. The grating section 216 includes a periodic structure, which diffracts light. The grating section 216 is a reflecting structure that has a periodic refractive index modulation. As shown, the grating section 216 is a dielectric mirror, also known as a Bragg mirror, also known as a distributed Bragg reflector (DBR). A DBR is a reflector used in waveguides to reflect optical signals. The DBR is a structure formed from multiple layers having different materials where each has a different refractive index, or by periodic variation of some characteristic (e.g., such as height) of a dielectric waveguide, resulting in periodic variation in the effective refractive index in the guide. Each layer of the DBR partially reflects an optical signal passing through the DBR. Therefore, the grating section 216 disperses the optical signal $S_{out}$ into wavelength components having corresponding diffraction peaks. In some examples, the grating section 216 has a length $L_{Grating}$ along a direction of optical signal propagation S. The tunable laser system 200 outputs light from a facet $F_{out}$, $F_G$ of the gain section 212.

The power monitor 220 (e.g., a photodiode) is at the back facet $F_B$ of the tunable laser 200 and adjacent to the grating section 216 (DBR section). It generates the power signal P which is proportional to the intensity or power of the light signal $S_{out}$.

The tunable laser 200 may be mounted on a thermoelectric cooler (TEC) 230 that receives a driving current $I_{TEC}$ (e.g., from the internal controller 210). The TEC 230 temperature may be a predetermined temperature to determine the temperature of the tunable laser 200. The internal controller 210 controls the driving current $I_{TEC}$, which determines the temperature of the TEC 230 and of the operating temperature of the tunable laser 200. In some examples, the internal controller 210 delivers the control current $I_{TEC}$ to the TEC 230 to set the temperature of the TEC 230 and therefore the gain and wavelength of the tunable laser 200.

During normal operation, the internal controller 210 receives commands from a host system, an external controller 150 (e.g., a mother board where the tunable laser 200 is mounted on) to set the output wavelength $\lambda_{out}$, and output optical power from the tunable laser 200. During calibration, the external controller 150 sends commands to the internal controller 210 of the tunable laser 200 (e.g., through the digital control interface) and controls external calibration devices, such as the optical spectrum analyzer 120, to calibrate the tunable laser 200. Moreover, the external controller 150 receives output power signals P from the power monitor 220 (through the internal controller interface) of the tunable laser 200 for use during calibration of the tunable laser 200. The external controller 150 may store a calibration routine 202 in its memory 152 for execution by its one or more data processing devices 154. After the external controller 150 executes the calibration routine 202 and determines all the calibration/bias parameters 208, the external controller 150 may issue commands to save the parameters 208 in the memory 204 of the internal controller 210 of the tunable laser 200, so that when the laser is deployed for operation, the internal controller 210 can load the pre-calibrated parameters 208 to operate the tunable laser 200 in a desired mode. The calibration routine 202 includes calibrating the output wavelength $\lambda_{out}$ of the tunable laser 200 (FIGS. 3-6) and calibrating a grating bias current $I_{grating}$ to the grating section 216, a laser bias current $I_{bias}$ delivered to the gain section 212, and a modulation current $I_{mod}$ delivered to the gain section 212.

The tunable wavelength laser 200 is capable of transmitting an optical signal at different wavelengths $\lambda$ in an optical transmitter within a telecommunication system, which provides for a colorless (i.e., wavelength-independent) optical source. The term color refers to the color of the wavelength $\lambda$. The emission wavelength $\lambda$ of a colorless optical transmitter source is nonspecific and can be determined by external factors (e.g., the wavelength $\lambda$ of an injection/seeding light onto the optical transmitter source). As such, identical optical transmitter sources can be mass produced and deployed across a telecommunication network and each tunable laser system 200 within an optical transmitter can be modulated by a data stream.

Figure 3:
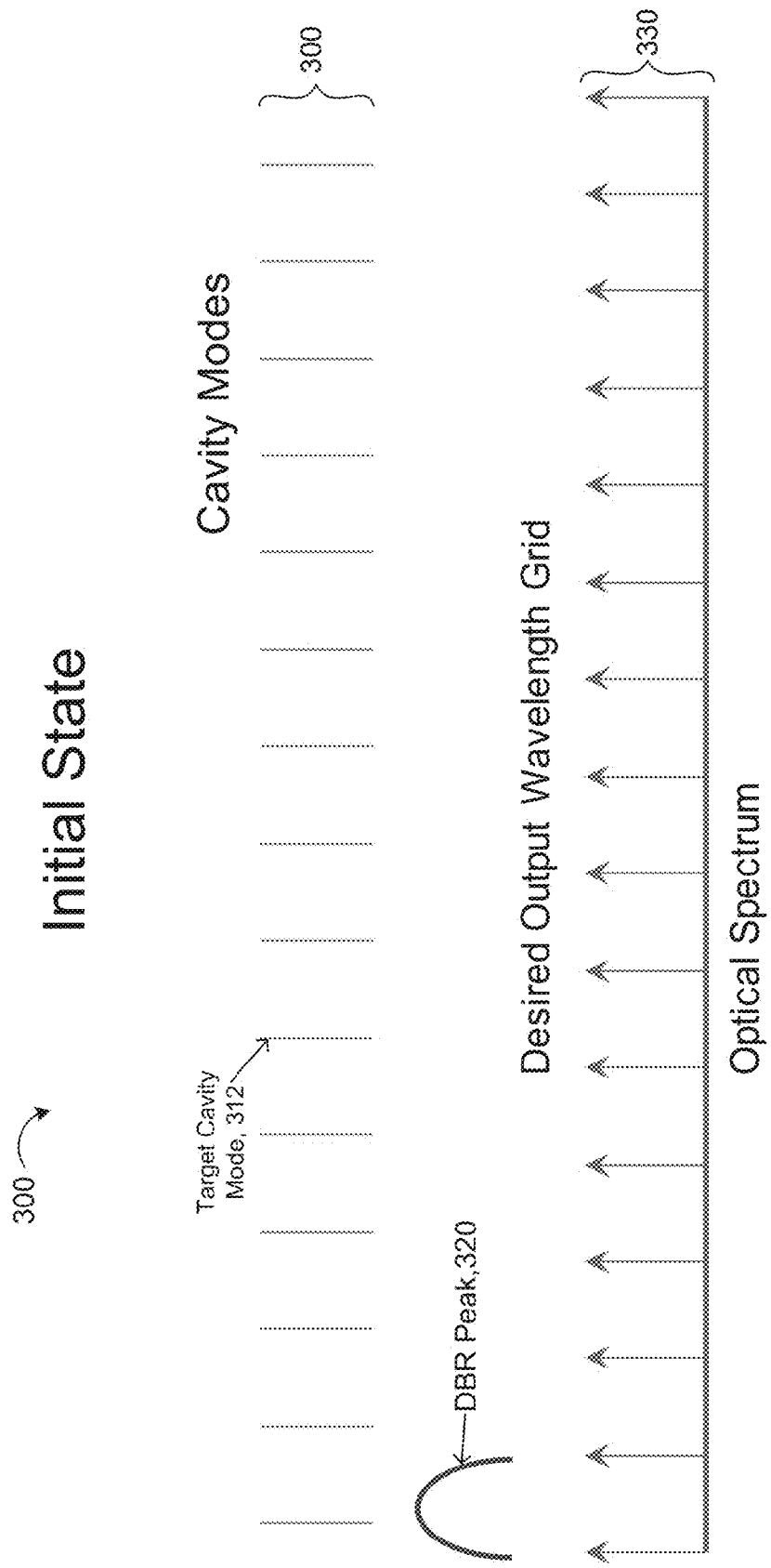
FIG. 3 is a schematic view of an initial state of the cavity mode and the DBR mode of the tunable laser of the tunable laser calibration system.
Figure 4A:
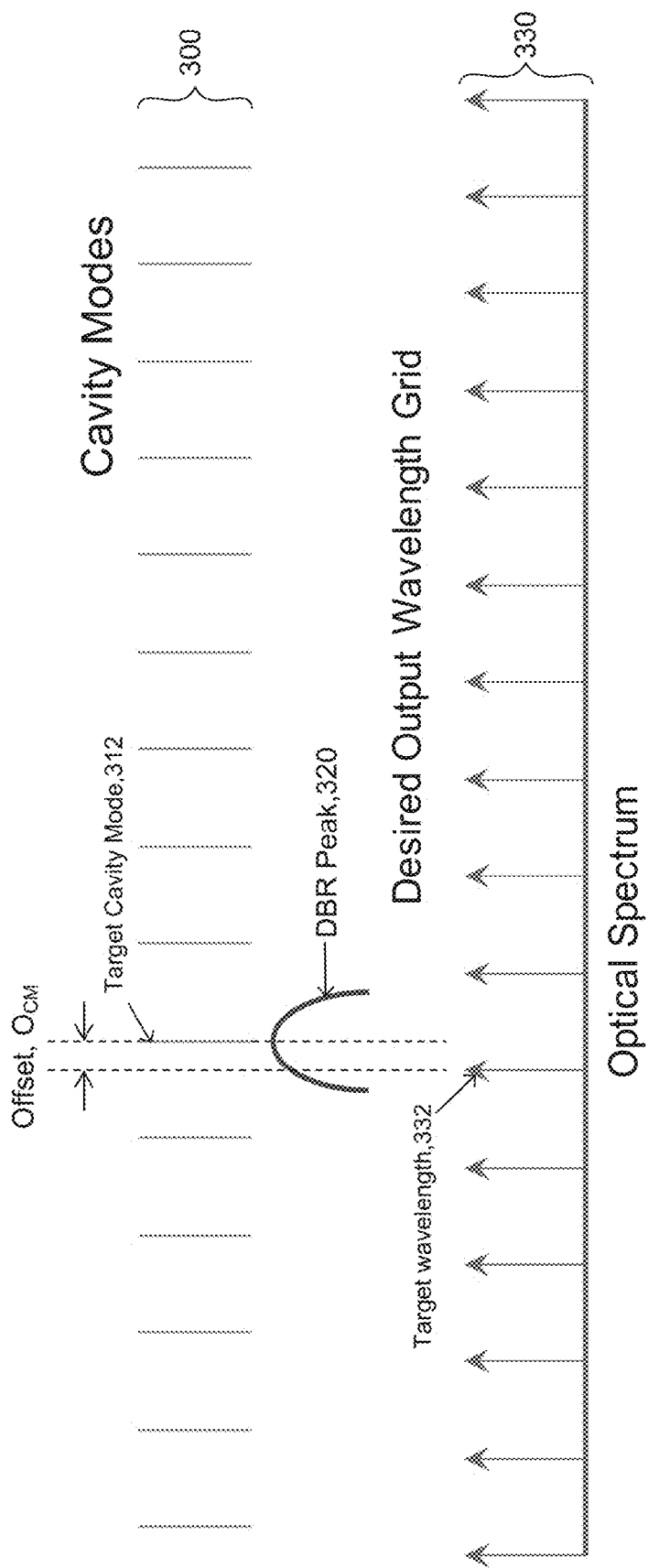
FIG. 4A is a schematic view of the process of aligning a DBR mode to a target cavity mode.
Figure 5:
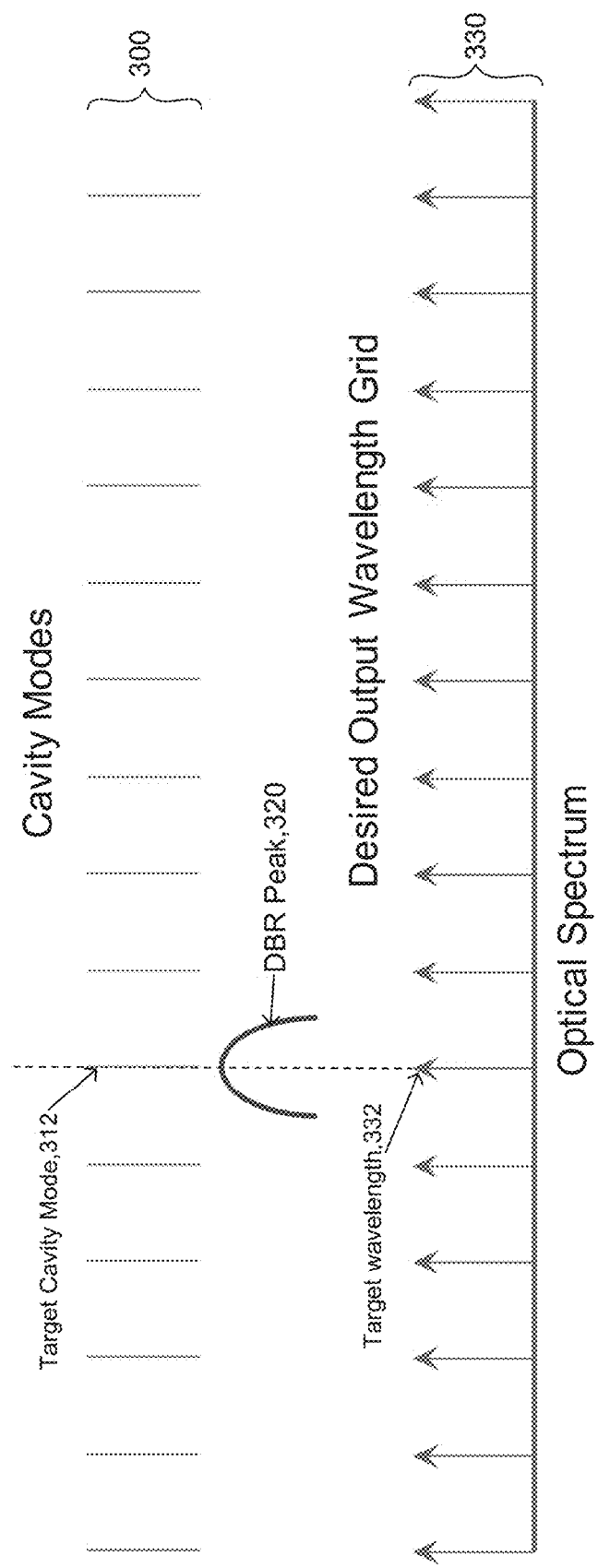
FIG. 5 is a schematic view of the process of aligning a resultant lasing mode with a target wavelength output grid.

FIGS. 3-5 illustrate exemplary initial states of cavity modes 300 and a DBR peak 320 with respect to a desired output frequency or wavelength grid 330. The light within a cavity (i.e., an optical cavity or optical resonator is an arrangement of mirrors that forms a standing wave cavity resonator for light wave) reflects multiple times producing a standing wave for certain resonance frequencies. These standing wave patterns are called modes. In general, radiation patterns produced on every round-trip of the light through the resonator are the most stable, and these form the modes of the resonator.

The calibration routine 202 includes three steps to calibrate the tunable laser 200. During the first step, the calibration routine 202 aligns a reflection peak (DBR peak 320) of the distributed Bragg reflector 216 with a target cavity mode 312 of a plurality of cavity modes 300. The plurality of cavity modes 300 are defined by a total optical path length $L_T$ inside a resonant cavity 211 (FIG. 2) defined by the distributed Bragg reflector 216, the phase-shift section 214, and the gain section 212 of the tunable laser 200. The grating section 216 acts as an effective reflection lens mirror, which forms a resonant cavity 211 with the gain section 212 and phase section 214. The resonant cavity 211 that the tunable laser 200 forms is similar to a resonant cavity between two mirrors in a Fabry-Perot laser. A Fabry-Perot (FP) Laser has two mirrors and an active region in-between, which forms a laser. The FP supports a multitude of wavelengths as long as the wavelength is a standing wavelength. In an FP laser, all mirrors are reflecting all the wavelengths, but in a tunable DBR laser 200, one of the mirrors is replaced with a DBR (distributed Bragg reflector 216), which only reflects certain wavelengths. The wavelength selectivity of the DBR mirror (grating section) 216 of the tunable laser 200 selects one of the many FP modes to lase. The resonant cavity 211 between the Bragg grating 216 and the gain section 212 experiences resonance having multiple resonant peaks 312.

The calibration routine 202 may include altering a bias current $I_{grating}$ applied to the tunable laser 200 (to the grating section 216) to align the reflection peak 320 of the distributed Bragg reflector 216 with the target cavity mode 312. The applied bias current $I_{grating}$ alters the grating peak frequency of the tunable laser 200 through electro-optic effect, which causes the tunable laser 200 to align the reflection peak 320 of the distributed Bragg reflector 216 with the target cavity mode 312. The temperature of the tunable laser 200 may be altered as well. Moreover, the calibration routine 202 may monitor the bias current $I_{grating}$ and the temperature of the tunable laser 200 and stores the values of the bias current $I_{grating}$ and the temperature in the non-transitory memory 204 when the reflection peak 320 is aligned with the target cavity mode 312, as shown in FIG. 4. In some examples, the calibration routine 202 alters a temperature of the resonant cavity 211 of the tunable laser 200 by a temperature increment (e.g., in steps of 0.2° C.) to shift a cavity frequency grid 300 defined by the plurality of cavity modes 312 to align with the reflection peak 320 of the distributed Bragg reflector 216. Lasing can occur when the reflection peak 320 of the distributed Bragg reflector 216 is aligned with the target cavity mode 312. The wavelength of the lasing mode can be determined based on the current injection (e.g., bias current $I_{grating}$).

The calibration routine 202 may align the DBR peak 320 with a cavity mode 312 using an OSA (optical spectrum analyzer) or a wave meter. After the calibration routine 202 aligns the reflection peak 320 of the distributed Bragg reflector 216 with the target cavity mode 312 and determines the lasing mode 400, the distributed Bragg reflector 216 rejects all other modes that were not selected. The alignment of the DBR peak 320 with the target cavity mode 312, however, produces one large mode (or lasing peak) 402 and neighboring side modes 404. Measuring the tunable laser output signal $S_{out}$ using an optical spectrum analyzer (e.g., measuring the magnitude of an input optical signal versus the frequency within the full frequency range) reveals side modes 404 of the output signal $S_{out}$ that are not fully rejected by the distributed Bragg reflector 216. When the reflection peak 320 of the distributed Bragg reflector 216 is aligned with the target cavity mode 312, the side modes 404 of the reflection peak 320 have equal magnitudes. Therefore, these side modes 404 may be used to calibrate the alignment of the reflection peak 320 of the distributed Bragg reflector 216 with the target cavity mode 312.

Referring to FIGS. 4A-4B, in some examples, the calibration routine 202 monitors an optical output $S_{out}$, 400 of the tunable laser 200 (e.g., using the power monitor 220) while aligning the reflection peak 320 of the distributed Bragg reflector 216 with the target cavity mode 312 to identify the side modes 404 of the resultant lasing mode 402 formed by aligning the reflection peak 320 with the target cavity mode 312. The calibration routine 202 determines that the reflection peak 320 is aligned with the target cavity mode 312 when the side modes 404 have equal amplitudes.

FIG. 4B shows a lasing mode 400 of the tunable laser 200 where the reflection peak 320 is aligned with the target cavity mode 312, and the side modes 404 have equal amplitudes. FIGS. 4C and 4D, however, show instances where the reflection peak 320 is not aligned with the target cavity mode 312; and therefore, the side modes 404 do not have equal amplitudes. An optical spectrum analyzer (OSA) may be used to measure the side modes 404 and verify that the side modes 404 are balanced on the two sides for the lasing mode 402. Once the two side modes 404 are balanced, then the cavity mode 300 and the DBR mode 320 are aligned. A wavelength meter 110 gives the exact wavelength reading of the main mode.

Referring to FIG. 5, during the second step, the calibration routine 202 aligns a resultant lasing mode 402 (i.e., the reflection peak 320 and the target cavity mode 312 aligned with each other) with a target wavelength 332 of an output wavelength grid 330. As explained, the resultant lasing mode 402 (FIG. 4B) is where the reflection peak 320 of the distributed Bragg reflector 216 is aligned with the target cavity mode 312; however, the resultant lasing mode 402 may also be explained in terms of frequency, since frequency is inversely proportional to wavelength. In some examples, the target wavelength grid 330 is one determined by the ITU (International Telecommunication Union). The ITU is a specialized agency of the United Nations responsible for issues concerning information and communication technologies. The ITU is responsible for making standards regarding communications. To align the resultant lasing mode 402 with the target wavelength 330 of an output wavelength grid 330, the calibration routine 202 determines an offset $O_{CM}$ between the resultant lasing mode 402 (or the alignment of the reflection peak 320 and the target cavity mode 312) and the target wavelength 332 of the output wavelength grid 330. Then the calibration routine 202 alters the temperature of the tunable laser 200 to align the resultant lasing mode with the target wavelength 332 of the output wavelength grid 330 (FIG. 5). In some examples, temperature tuning the tunable laser 200 includes applying a current $I_{TEC}$ to the TEC 230, which results in temperature change of the tunable laser 200. The temperature setting for each desired output wavelength $\lambda_{out}$ is saved in the non-transitory memory 204.

During the third step, the calibration routine 202 sets a target output power P and a target extinction ratio ER of the tunable laser 200. The calibration routine 202 includes calibrating the output wavelengths $\lambda_{out}$ of the tunable laser by aligning the cavity modes 312, the DBR peak 320, and the output reference grid 300 all with the desired output wavelength $\lambda_{out}$. The calibration routine 202 includes calibrating the biased current $I_{bias}$ and the modulation current $I_{mod}$ to provide a desired extinction ratio ER of the tunable laser 200. The biased current $I_{bias}$ and the modulation current $I_{mod}$ directly affect the average output power, the output modulation amplitude (OMA) and extinction ratio (ER) of the tunable laser 200.

Figure 6:
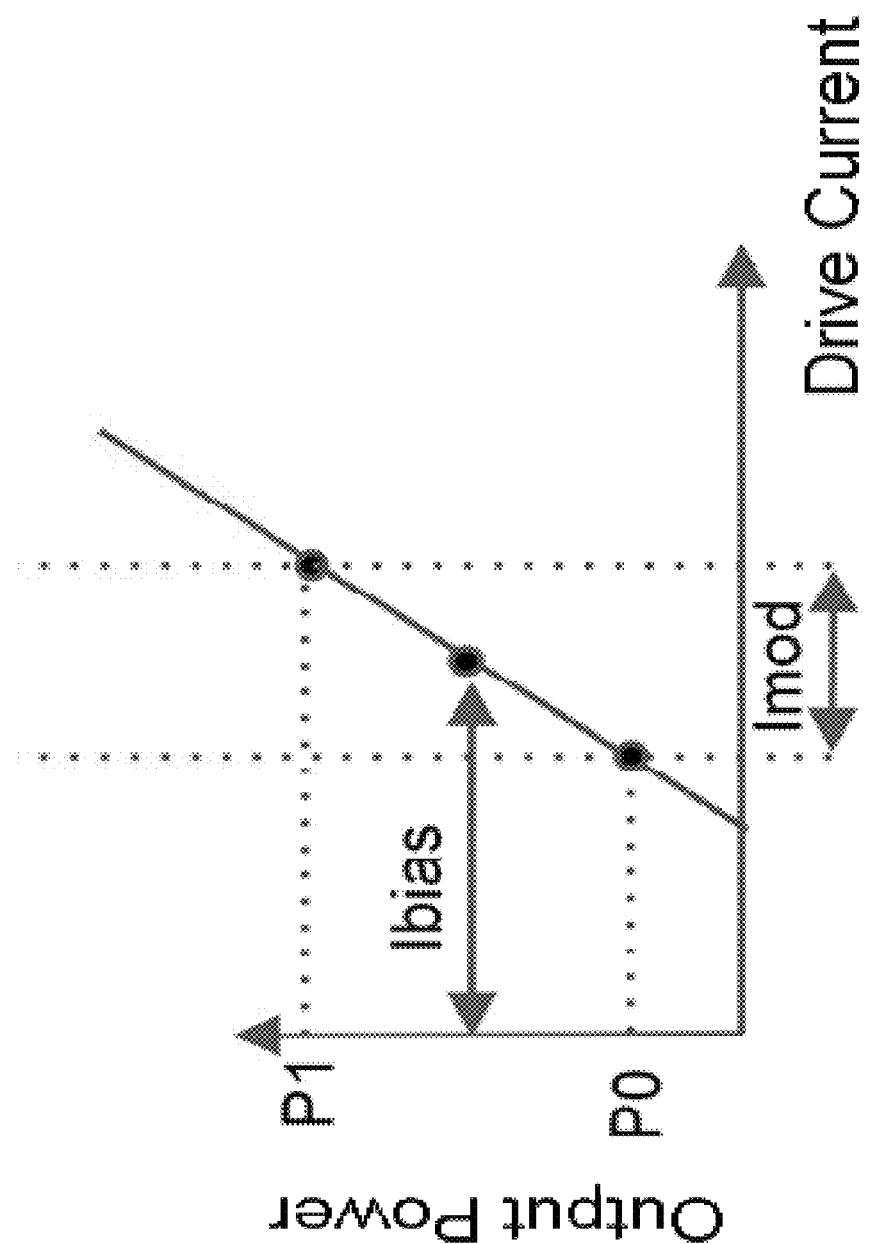
FIG. 6 is schematic view of an exemplary curve for a tunable laser.

Referring to FIG. 6, the tunable laser 200 output power (P) depends on the gain section drive current (I) shown in the L-I curve, measurements of the output power P vs. current I in the linear region gives a slope efficiency of the laser S, where S=ΔP/ΔI. The controller 150, 210 may determine the L-I curve by monitoring the laser output (e.g., at each wavelength) using the built-in power monitor 220 while sweeping the drive current I from a first threshold to a second threshold. The bias current $I_{bias}$ and modulation current $I_{mod}$ are stored in the non-transitory memory 204 as the operation condition.

In some implementations, the external controller 150 monitors the optical power P of the optical output signal $S_{out}$ of the tunable laser 200 using the power monitor 220 (e.g., using a photodiode 220, such as one built into the tunable laser 200) while electrically biasing the tunable laser 200 at a first power level $P_1$ (e.g., a high power level) and at a second power level $P_0$ (e.g., a low power level) lower than the first power level $P_1$. In some examples, the calibration routine 202 monitors the output power P of the optical output signal $S_{out}$ of the tunable laser 200 at each wavelength of the output wavelength grid 300 while varying a modulation current $I_{mod}$ delivered to again section 212 of the tunable laser 200 between a minimum modulation current $I_{m\_min}$ and a maximum modulation current $I_{m\_max}$. The calibration routine 202 determines a modulation current $I_{mod}$ of the gain section 212 of the tunable laser 200 based on a relationship between the output power $P_{out}$ of the tunable laser 200 and the modulation current $I_{mod}$ applied to the gain section 212.

The calibration routine 202 determines the bias current $I_{bias}$ and modulation current $I_{mod}$ using the following equation:

$$ER = \frac{P_1}{P_0} = \frac{I_{bias} + \frac{I_{mod}}{2} - I_{th}}{I_{bias} - \frac{I_{mod}}{2} - I_{th}} \quad (1)$$

where ER is the target extinction ratio, $P_1$ is the first power level, $P_0$ is the second power level, $I_{bias}$ is a bias current applied to the gain section 212, $I_{mod}$ is a modulation current applied to the gain section 212, and $I_{th}$ is a threshold current (e.g., a minimum current) for the tunable laser 200 to reach the transparent state.

The calibration routine 202 determines the modulation current $I_{mod}$ of the gain section 212 of the tunable laser using:

$$I_{mod} = \frac{OMA}{S} \quad (2)$$

where $I_{mod}$ is the modulation current, OMA is an optical modulation amplitude, and S is a slope efficiency (S=ΔP/ΔI).

The calibration routine 202 determines the bias current $I_{bias}$ of the grating section 216 of the tunable laser 200 using:

$$I_{bias} = \frac{I_{mod}}{ER-1} + \frac{I_{mod}}{2} + I_{th} \quad (3)$$

wherein $I_{bias}$ is the bias current, $I_{mod}$ is the modulation current applied to the gain section 212, ER is a desired extinction ratio of the laser, and $I_{th}$ is a threshold current.

Based on the above calculation of the bias current $I_{bias}$ and modulation current $I_{mod}$, the calibration routine 202 sets the bias current $I_{bias}$ for the gain section 212 and the modulation current $I_{mod}$ for the gain section 212 of the tunable laser 200 to set the target output power P and the target extinction ratio ER of the tunable laser 200 at a particular wavelength. The calibration of the bias current $I_{bias}$ and modulation current $I_{mod}$ is repeated for every output wavelength In general, tunable lasers 200 tend to experience a current drift as the laser ages. The tunable laser system 200 is self-calibrating and the calibration routine for the bias current $I_{bias}$ and the modulation current $I_{mod}$ may be self-contained in the internal controller 210 and may be routinely executed to correct for any laser bias current drifts as the laser ages. Therefore, the tunable laser 200 provides improved performance over the life time for the tunable lasers.

Figure 7:
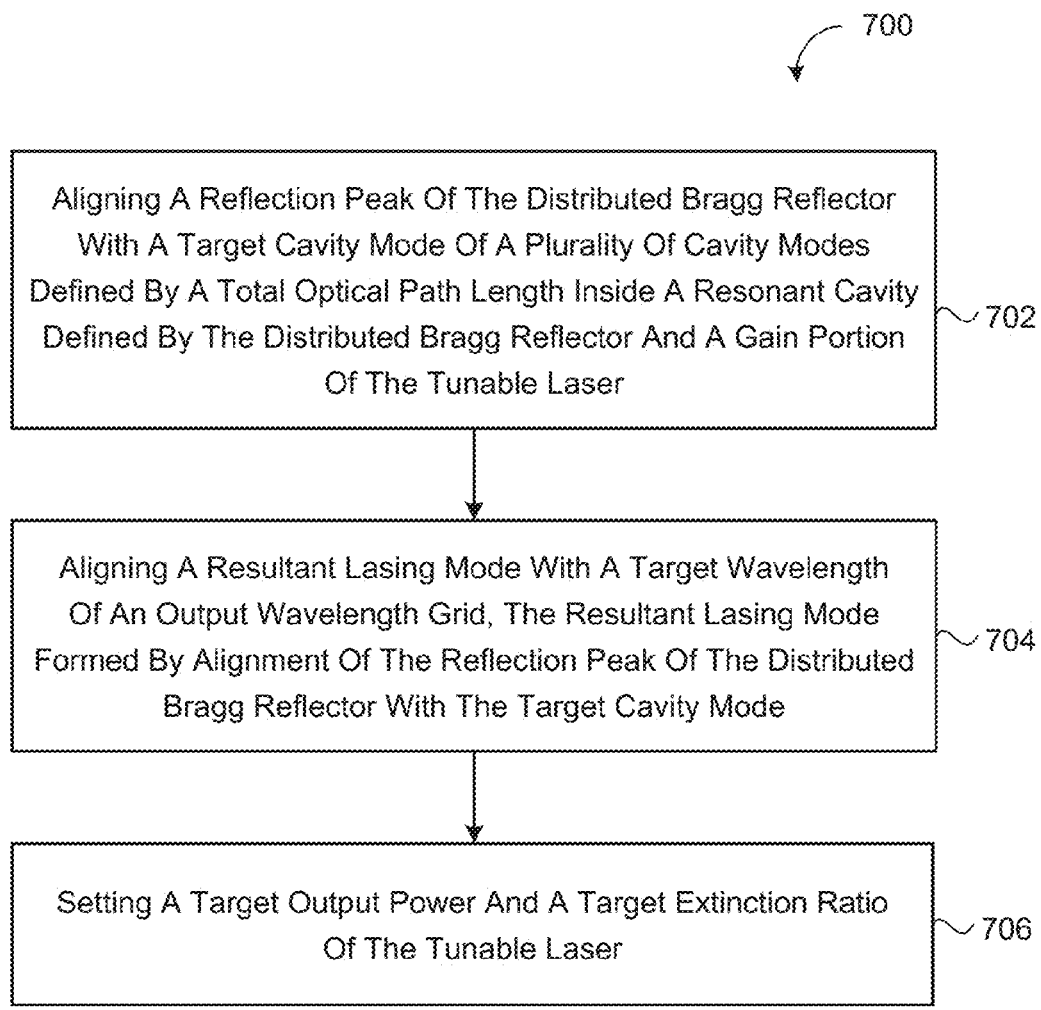
FIG. 7 is a schematic view of an exemplary arrangement of operations for using a tunable laser calibration system.

Referring to FIG. 7, in some implementations, a method 700 of calibrating a tunable laser 200 includes aligning 702 a reflection peak 320 of the distributed Bragg reflector 216 with a target cavity mode 312 of a plurality of cavity modes 300 defined by a total optical path length $L_T$ inside a resonant cavity 211 defined by the distributed Bragg reflector 216, the phase section 214, and the gain section 212 of the tunable laser 200. The method 700 includes aligning 704 a resultant lasing mode 402 with a target wavelength 332 of an output wavelength grid 330. The resultant lasing mode 402 is formed by an alignment of the reflection peak 320 of the distributed Bragg reflector 216 with the target cavity mode 312. The method 700 also includes setting 706 a target output power P and a target extinction ratio ER of the tunable laser 200.

In some implementations, the method 700 includes altering a bias current $I_{grating}$ applied to the tunable laser 200 to align the reflection peak 320 of the distributed Bragg reflector 216 with the target cavity mode 312. The method 700 further includes monitoring the bias current $I_{grating}$ and storing the bias current $I_{grating}$ in non-volatile memory 204 of the internal controller 210.when the reflection peak 320 is aligned with the target cavity mode 312.

In some examples, the method 700 further includes altering a temperature of the tunable laser 200 to align the reflection peak 320 of the distributed Bragg reflector 216 with the target cavity mode 312. The method 700 may include monitoring the temperature of the tunable laser 200 and storing the temperature in non-transitory memory 152, 204 when the reflection peak 320 is aligned with the target cavity mode 312.

In some implementations, the method 700 includes altering the temperature of the resonant cavity 211 of the tunable laser 200 by a threshold temperature increment (e.g., in 0.2 degrees Celsius steps) to shift a cavity frequency grid defined by the plurality of cavity modes to align with the reflection peak 320 of the distributed Bragg reflector 216.

The method 700 may include determining an offset $O_{CM}$ between the resultant lasing mode 402 and the target wavelength 332 of the output wavelength grid 330. In some examples, the method 700 includes altering the temperature of the tunable laser 200 to align the resultant lasing mode 402 with the target wavelength 332 of the output wavelength grid 330.

In some implementations, the method 700 includes monitoring an optical output $S_{out}$, 400 of the tunable laser 200 while aligning the reflection peak 320 of the distributed Bragg reflector 216 with the target cavity mode 312 to identify side modes 404 of the resultant lasing mode 402 formed by alignment of the reflection peak 320 of the distributed Bragg reflector 216 with the target cavity mode 312. The method 700 may also include determining that the reflection peak 320 is aligned with the target cavity mode 312 when the side modes 404 have equal amplitudes.

The method 700 may further include monitoring the output power P of the optical output $S_{out}$, 400 of the tunable laser 200 at each wavelength of the output wavelength grid 330 while varying a modulation current $I_{mod}$ delivered to the gain section 212 of the tunable laser 200 between a minimum modulation current $I_{m\_min}$ and a maximum modulation current $I_{m\_max}$. In some examples, the method 700 further includes determining the modulation current $I_{mod}$ of the gain section 212 of the tunable laser 200 based on a relationship between the output power P of the tunable laser 200 and the modulation current $I_{mod}$ applied to the gain section 212. The method 700 may also include monitoring the output power P of the tunable laser 200 using a photodiode 220 of the tunable laser 200.

Various implementations of the systems and techniques described here can be realized in digital electronic and/or optical circuitry, integrated circuitry, specially designed ASICs (application specific integrated circuits), computer hardware, firmware, software, and/or combinations thereof. These various implementations can include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device.

These computer programs (also known as programs, software, software applications or code) include machine instructions for a programmable processor, and can be implemented in a high-level procedural and/or object-oriented programming language, and/or in assembly/machine language. As used herein, the terms "machine-readable medium" and "computer-readable medium" refer to any computer program product, non-transitory computer readable medium, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. The term "machine-readable signal" refers to any signal used to provide machine instructions and/or data to a programmable processor.

Implementations of the subject matter and the functional operations described in this specification can be implemented in digital electronic circuitry, or in computer software, firmware, or hardware, including the structures disclosed in this specification and their structural equivalents, or in combinations of one or more of them. Moreover, subject matter described in this specification can be implemented as one or more computer program products, i.e., one or more modules of computer program instructions encoded on a computer readable medium for execution by, or to control the operation of data processing apparatus. The computer readable medium can be a machine-readable storage device, a machine-readable storage substrate, a memory device, a composition of matter effecting a machine-readable propagated signal, or a combination of one or more of them. The terms "data processing apparatus", "computing device" and "computing processor" encompass all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them. A propagated signal is an artificially generated signal, e.g., a machine-generated electrical, optical, or electromagnetic signal, that is generated to encode information for transmission to suitable receiver apparatus.

A computer program (also known as an application, program, software, software application, script, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Moreover, a computer can be embedded in another device, e.g., a mobile telephone, a personal digital assistant (PDA), a mobile audio player, a Global Positioning System (GPS) receiver, to name just a few. Computer readable media suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

To provide for interaction with a user, one or more aspects of the disclosure can be implemented on a computer having a display device, e.g., a CRT (cathode ray tube), LCD (liquid crystal display) monitor, or touch screen for displaying information to the user and optionally a keyboard and a pointing device, e.g., a mouse or a trackball, by which the user can provide input to the computer. Other kinds of devices can be used to provide interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

While this specification contains many specifics, these should not be construed as limitations on the scope of the disclosure or of what may be claimed, but rather as descriptions of features specific to particular implementations of the disclosure. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multi-tasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

A number of implementations have been described. Nevertheless, it will be understood that various modifications may be made without departing from the spirit and scope of the disclosure. Accordingly, other implementations are within the scope of the following claims. For example, the actions recited in the claims can be performed in a different order and still achieve desirable results.

What is claimed is:

1. A method of calibrating a directly modulated tunable laser having a distributed Bragg reflector, the method comprising:

aligning a reflection peak of the distributed Bragg reflector with a target cavity mode of a plurality of cavity modes defined by a total optical path length inside a resonant cavity defined by the distributed Bragg reflector, a phase section, and a gain section of the tunable laser, the aligning of the reflection peak comprising altering a temperature of the resonant cavity of the directly modulated tunable laser by a threshold temperature increment to shift a cavity frequency grid defined by the plurality of cavity modes to align with the reflection peak of the distributed Bragg reflector;

aligning a resultant lasing mode with a target wavelength of an output wavelength grid, the resultant lasing mode formed by alignment of the reflection peak of the distributed Bragg reflector with the target cavity mode; and setting a target output power and a target extinction ratio of the tunable laser.

2. The method of claim 1, further comprising altering a bias current applied to the grating section of the tunable laser to align the reflection peak of the distributed Bragg reflector with the target cavity mode.

3. The method of claim 2, further comprising:

monitoring the bias current; and storing the bias current in non-transitory memory when the reflection peak is aligned with the target cavity mode.

4. The method of claim 1, further comprising altering a temperature of the tunable laser to align the reflection peak of the distributed Bragg reflector with the target cavity mode.

5. The method of claim 4, further comprising:
monitoring the temperature of the tunable laser; and
storing the temperature in non-transitory memory when the reflection peak is aligned with the target cavity mode.

6. The method of claim 1, further comprising determining an offset between the resultant lasing mode and the target wavelength of the output wavelength grid.

7. The method of claim 1, further comprising altering a temperature of the tunable laser to align the resultant lasing mode with the target wavelength of the output wavelength grid.

8. The method of claim 1, further comprising monitoring an output power of an optical output of the tunable laser at each wavelength of an output wavelength grid while varying a modulation current delivered to the gain section of the tunable laser between a minimum modulation current and a maximum modulation current.

9. The method of claim 8, further comprising determining the modulation current of the gain section of the tunable laser based on a relationship between the output power of the tunable laser and the modulation current applied to the gain section.

10. The method of claim 9, further comprising determining the modulation current of the gain section of the tunable laser using:

$$I_{mod} = \frac{OMA}{S}$$

wherein $I_{mod}$ is the modulation current, OMA is an optical modulation amplitude, and S is a slope efficiency of the laser.

11. The method of claim 8, further comprising monitoring the output power of the tunable laser using a photodiode of the tunable laser.

12. A method of calibrating a directly modulated tunable laser having a distributed Bragg reflector, the method comprising:
aligning a reflection peak of the distributed Bragg reflector with a target cavity mode of a plurality of cavity modes defined by a total optical path length inside a resonant cavity defined by the distributed Bragg reflector, a phase section, and a gain section of the tunable laser;
monitoring an optical output of the tunable laser while aligning the reflection peak of the distributed Bragg reflector with the target cavity mode to identify side modes of a resultant lasing mode formed by alignment of the reflection peak of the distributed Bragg reflector with the target cavity mode;
aligning the resultant lasing mode with a target wavelength of an output wavelength grid;
determining that the reflection peak is aligned with the target cavity mode when the neighboring side modes have equal amplitudes; and
setting a target output power and a target extinction ratio of the tunable laser.

13. A method of calibrating a directly modulated tunable laser having a distributed Bragg reflector, the method comprising:
aligning a reflection peak of the distributed Bragg reflector with a target cavity mode of a plurality of cavity modes defined by a total optical path length inside a resonant cavity defined by the distributed Bragg reflector, a phase section, and a gain section of the tunable laser, the aligning of the reflection peak comprising:
monitoring an output power of an optical output of the tunable laser at each wavelength of an output wavelength grid while varying a modulation current delivered to the gain section of the tunable laser between a minimum modulation current and a maximum modulation current;
determining the modulation current of the gain section of the tunable laser based on a relationship between the output power of the tunable laser and the modulation current applied to the gain section, the modulation current of the gain section of the tunable laser determined as:

$$I_{mod} = \frac{OMA}{S}$$

wherein $I_{mod}$ is the modulation current, OMA is an optical modulation amplitude, and S is a slope efficiency of the laser; and
altering a bias current applied to the grating section of the tunable laser to align the reflection peak of the distributed Bragg reflector with the target cavity mode, the bias current of the distributed Bragg reflector of the tunable laser determined as:

$$I_{bias} = \frac{I_{mod}}{ER-1} + \frac{I_{mod}}{2} + I_{th}$$

wherein $I_{bias}$ is the bias current, $I_{mod}$ is the modulation current, ER is a desired extinction ratio of the laser, and $I_{th}$ is a threshold current;
aligning a resultant lasing mode with a target wavelength of an output wavelength grid, the resultant lasing mode formed by alignment of the reflection peak of the distributed Bragg reflector with the target cavity mode; and
setting a target output power and a target extinction ratio of the tunable laser.

14. A tunable laser calibration system comprising:
a tunable laser comprising:
a gain section;
a distributed Bragg reflector optically connected with the gain section; and
a power monitor optically connected to the gain section; and
a controller in communication with the tunable laser, the controller comprising:
non-transitory memory; and
one or more data processing devices in communication with the non-transitory memory, the one or more data processing devices executing instructions configuring the one or more data processing devices to execute a calibration routine comprising:
aligning a reflection peak of the distributed Bragg reflector with a target cavity mode of a plurality of cavity modes defined by a total optical path length inside a resonant cavity defined by the distributed Bragg reflector and the gain section of the tunable laser, the aligning of the reflection peak comprising altering a temperature of the resonant cavity of the directly modulated tunable laser by a threshold temperature increment to shift a cavity frequency grid defined by the plurality of cavity modes to align with the reflection peak of the distributed Bragg reflector;

aligning a resultant lasing mode with a target wavelength of an output wavelength grid, the resultant lasing mode formed by alignment of the reflection peak of the distributed Bragg reflector with the target cavity mode; and setting a target output power and a target extinction ratio of the tunable laser.

15. The tunable laser calibration system of claim 14, wherein the power monitor comprises a photodiode.

16. The tunable laser calibration system of claim 14, wherein the calibration routine further comprises altering a bias current applied to the distributed Bragg reflector of the tunable laser to align the reflection peak of the distributed Bragg reflector with the target cavity mode.

17. The tunable laser calibration system of claim 16, wherein the calibration routine further comprises:
monitoring the bias current; and
storing the bias current in the non-transitory memory when the reflection peak is aligned with the target cavity mode.

18. The tunable laser calibration system of claim 14, wherein the calibration routine further comprises altering a temperature of the tunable laser to align the reflection peak of the distributed Bragg reflector with the target cavity mode.

19. The tunable laser calibration system of claim 18, wherein the calibration routine further comprises:
monitoring the temperature of the tunable laser; and
storing the temperature in the non-transitory memory when the reflection peak is aligned with the target cavity mode.

20. The tunable laser calibration system of claim 14, wherein the calibration routine further comprises determining an offset between the resultant lasing mode and the target wavelength of the output wavelength grid.

21. The tunable laser calibration system of claim 14, wherein the calibration routine further comprises altering a temperature of the tunable laser to align the resultant lasing mode with the target wavelength of the output wavelength grid.

22. The tunable laser calibration system of claim 14, wherein the calibration routine further comprises:
monitoring an optical output of the tunable laser while aligning the reflection peak of the distributed Bragg reflector with a target cavity mode to identify adjacent side modes of the resultant lasing mode formed by alignment of the reflection peak of the distributed Bragg reflector with the target cavity mode; and
determining that the reflection peak is aligned with the target cavity mode when the adjacent side modes have equal amplitudes.

23. The tunable laser calibration system of claim 14, wherein the calibration routine further comprises monitoring an output power of an optical output of the tunable laser at each wavelength of the output wavelength grid while varying a modulation current delivered to the gain section of the tunable laser between a minimum modulation current and a maximum modulation current.

24. The tunable laser calibration system of claim 23, wherein the calibration routine further comprises determining the modulation current of the gain section of the tunable laser based on a relationship between the output power of the tunable laser and the modulation current applied to the gain section.

25. The tunable laser calibration system of claim 24, wherein the calibration routine further comprises determining the modulation current of the gain section of the tunable laser using:

$$I_{mod} = \frac{OMA}{S}$$

wherein $I_{mod}$ is the modulation current, OMA is an optical modulation amplitude, and S is a slope efficiency of the laser.

26. The tunable laser calibration system of claim 25, wherein the calibration routine further comprises determining a bias current of the distributed Bragg reflector of the tunable laser using:

$$I_{bias} = \frac{I_{mod}}{ER-1} + \frac{I_{mod}}{2} + I_{th}$$

wherein $I_{bias}$ is the bias current, $I_{mod}$ is the modulation current, ER is a desired extinction ratio of the laser, and $I_{th}$ is a threshold current.

27. The tunable laser calibration system of claim 23, wherein monitoring the output power of the tunable laser comprises monitoring the output power using a photodiode of the tunable laser.

* * * * *